US009287830B2

(12) United States Patent
Scherrer

(10) Patent No.: US 9,287,830 B2
(45) Date of Patent: Mar. 15, 2016

(54) STACKED BIAS I-V REGULATION

(71) Applicant: NORTHROP GRUMMAN SYSTEMS CORPORATION, Falls Church, VA (US)

(72) Inventor: Daniel R. Scherrer, Glendale, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/458,996

(22) Filed: Aug. 13, 2014

(65) Prior Publication Data

US 2016/0049909 A1 Feb. 18, 2016

(51) Int. Cl.
*H03F 3/45* (2006.01)
*G05F 1/00* (2006.01)
*H03F 1/02* (2006.01)
*H03F 3/193* (2006.01)

(52) U.S. Cl.
CPC .............. *H03F 1/0233* (2013.01); *H03F 3/193* (2013.01); *H03F 3/45076* (2013.01); *H03F 2200/451* (2013.01); *H03F 2203/45116* (2013.01)

(58) Field of Classification Search
CPC ..................................... H03F 3/45; G05F 1/00
USPC ................... 330/260, 277; 323/269
See application file for complete search history.

(56) References Cited

U.S. PATENT DOCUMENTS

| | | |
|---|---|---|
| 3,886,466 A | 5/1975 | Wheatley, Jr. |
| 3,887,880 A | 6/1975 | Leidich |
| 4,361,785 A * | 11/1982 | Stapleton ................. G09G 1/04 315/382 |
| 5,210,505 A | 5/1993 | Eddlemon |
| 5,231,316 A * | 7/1993 | Thelen, Jr. .............. H03F 1/301 327/103 |
| 5,451,909 A | 9/1995 | Fattaruso |
| 5,493,207 A | 2/1996 | Beasom |
| 5,798,723 A | 8/1998 | Fong |
| 5,969,568 A | 10/1999 | Vester |
| 6,683,499 B2 | 1/2004 | Lautzenhiser et al. |
| 7,173,482 B2 | 2/2007 | Lobb et al. |
| 7,202,654 B1 | 4/2007 | Dadashev et al. |

(Continued)

FOREIGN PATENT DOCUMENTS

WO  WO 2012/101467 A1  8/2012

OTHER PUBLICATIONS

Säckinger, Eduard, "A High-Swing, High-Impedance MOS Cascode Circuit" IEEE Journal of Solid-State Circuits, vol. SC-25, No. 1, Feb. 1990, pp. 1-10.

*Primary Examiner* — Patricia T Nguyen
(74) *Attorney, Agent, or Firm* — John A. Miller; Miller IP Group, PLC

(57) ABSTRACT

A RF amplifier circuit including a plurality of FET devices, where a source terminal of an FET device is electrically coupled to the drain terminal of another FET device. The circuit further includes a voltage divider network and a plurality of operational amplifiers, where a separate one of the operational amplifiers is provided for each FET device. Each operational amplifier includes a positive input terminal, a negative input terminal and an output terminal, where the output terminal for a particular operational amplifier is electrically coupled to a gate terminal of a particular FET device, the negative input terminal of each operational amplifier is electrically coupled to the source terminal of the particular FET device and the positive input terminal of each operational amplifier is electrically coupled to the voltage divider network. A source resistor is electrically coupled to the source terminal of a bottom FET device in the stack.

15 Claims, 4 Drawing Sheets

(56) References Cited

U.S. PATENT DOCUMENTS

| | | |
|---|---|---|
| 7,279,985 B2 | 10/2007 | Chang et al. |
| 7,477,095 B2 | 1/2009 | Apfel |
| 7,528,648 B2 | 5/2009 | Raimar |
| 7,551,020 B2 * | 6/2009 | Bhattacharya ... H03K 19/00384 327/538 |
| 7,675,273 B2 | 3/2010 | Ko et al. |
| 7,973,518 B2 | 7/2011 | Shor et al. |
| 8,446,173 B1 * | 5/2013 | Faucher ........... H03K 19/00361 326/27 |
| 8,482,266 B2 | 7/2013 | Yu et al. |
| 2004/0150473 A1 | 8/2004 | Hollingsworth et al. |
| 2009/0108918 A1 * | 4/2009 | Chellappa ................. G05F 3/30 327/539 |
| 2011/0025422 A1 | 2/2011 | Marra et al. |
| 2012/0319738 A1 * | 12/2012 | Nakamura ................ H03L 7/00 327/102 |
| 2013/0249634 A1 | 9/2013 | Anatoly Genik |

\* cited by examiner

STACKED BIAS I-V REGULATION

BACKGROUND

1. Field

This invention relates generally to a stacked field effect transistor (FET) based radio-frequency (RF) amplifier circuit and, more particularly, to a stacked FET based RF amplifier circuit including an op-amp for each FET that corrects the gate bias for each FET in the stack using feedback from the source of that FET to correct the source voltage to a reference voltage level as provided by a voltage divider so as to provide the desired drain current and drain to source voltage to each FET to attain optimal performance.

2. Discussion

Amplifiers that employ one or more FET devices for amplifying RF signals are well known in the art. RF amplifiers of this type have many applications including, but not limited to, low noise amplifiers (LNA), intermediate frequency (IF) amplifiers, local oscillator (LO) amplifiers, etc. The particular RF signal being amplified is provided to the gate terminal of the FET device, where the amplified RF signal is output at the drain terminal of the device. These types of RF amplifiers often employ stacked FET devices, where the FET devices share the same drain-to-source current $I_{ds}$ and a source resistor to regulate the current.

In order to provide RF signal amplification, the FET device requires two DC bias voltages, where for a typical FET RF amplifier circuit, the DC bias voltages are independent of the RF signal, and where the bias voltages include a drain-to-source bias voltage $V_{ds}$ that allows charge flow through the device and a gate-to-source bias voltage $V_{gs}$ that controls the width of the channel, where the gate-to-source bias voltage $V_{gs}$ modulates the current flow through the channel. The gate-to-source bias voltage $V_{gs}$ is controlled by applying a reference voltage potential to the gate terminal of the FET device. Further, the drain-to-source bias voltage $V_{ds}$ is controlled by providing a controlled drain-to-source current $I_{ds}$, sometimes referred to herein as the drain current. Particularly, the goal of the FET drain current $I_{ds}$ is to define the drain-to-source potential $V_{ds}$ at a desired value. These bias voltages are optimized for a particular desired amplification, and performance. For example, for an LNA, the bias voltages would be selected to provide a low noise figure.

A number of techniques are known in the art to control the drain-to-source current $I_{ds}$ through the FET device in a RF amplifier circuit to control the desired drain-to-source bias voltage $V_{ds}$. These techniques include FET circuits that provide dual-bias, self-bias, and current regulation through drain current feedback. However, these known techniques for controlling the bias of an FET device in a RF amplifier have heretofore been limited in their ability to overcome environmental factors, such as temperature variation and array gradients, device drift and manufacturing and process variations.

DETAILED DESCRIPTION OF THE EMBODIMENTS

The following discussion of the embodiments of the invention directed to a stacked FET based RF amplifier circuit employing a stacked voltage current regulator is merely exemplary in nature, and is in no way intended to limit the invention or its applications or uses. For example, the below described approach can also be used for a stack of bipolar devices rather than FET devices.

Figure 1:
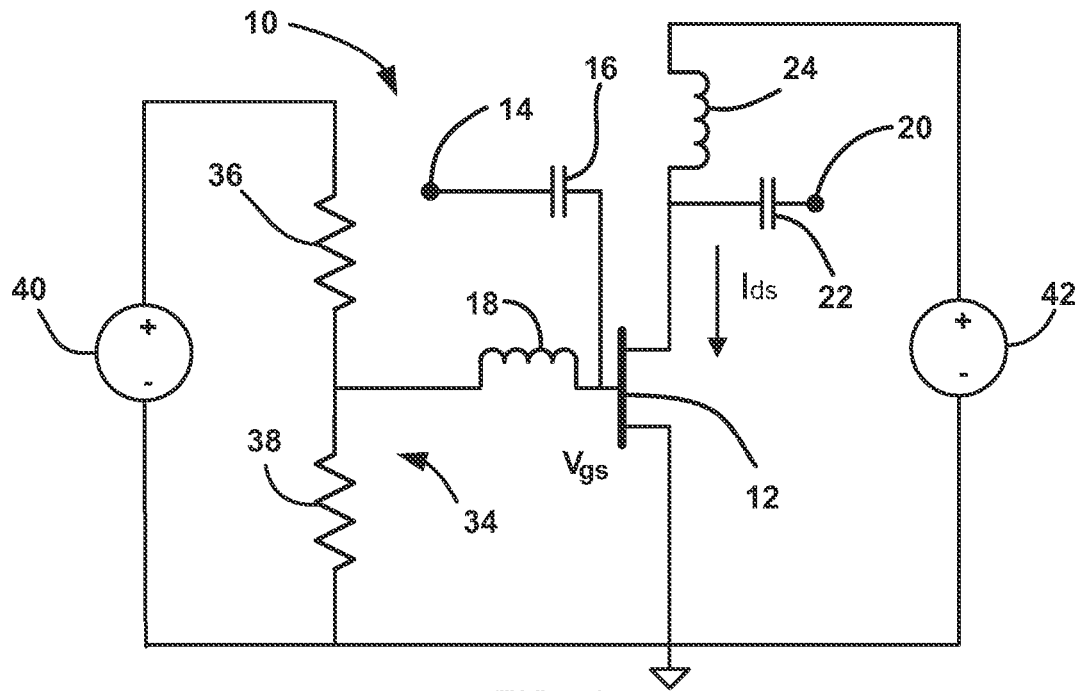
FIG. 1 is a schematic diagram of a known dual-bias RF amplifier circuit.

FIG. 1 is a schematic diagram of a known dual-bias RF amplifier circuit 10 including an FET device 12 having a source terminal, a gate terminal and a drain terminal. The RF signal to be amplified is applied to a node 14 in the circuit 10 that is coupled to the gate terminal of the FET device 12 through an RC circuit defined by a capacitor 16 and an inductor 18. The RF signal is amplified by the FET device 12 and the amplified RF signal is output from the circuit 10 at a node 20 through an LC circuit defined by a capacitor 22 and an inductor 24. A voltage source 40 is electrically coupled across a voltage divider 34 including resistors 36 and 38 that divide the voltage from the source 40 and provides a desired reference voltage $V_g$ to the gate terminal of the FET device 12 to provide the gate-to-source bias voltage $V_{gs}$. For example, the voltage source 40 may be 5 volts providing a divided gate reference voltage $V_g$ of −0.5 volts. A voltage source 42 is electrically connected across the source and drain terminals of the FET device 12 and provides the voltage potential $V_{ds}$ and the drain-to-source current $I_{ds}$.

The advantage of the dual-bias approach of the circuit 10 is its simplicity, however, it is an open loop approach that does not monitor the drain current $I_{ds}$ and provide feedback to the gate terminal of the FET device 12 to control the bias voltage $V_{gs}$. As such, the circuit 10 is susceptible to process variations, where the gate reference voltage $V_g$ and the drain current $I_{ds}$ may not be ideal from device to device. Further, manufacturing and environmental factors, such as $V_{gs}$ variations, gate currents, temperature and RF drive may result in inaccuracies in the bias voltages either at the beginning of life or end of life of the FET device 12.

Figure 2:
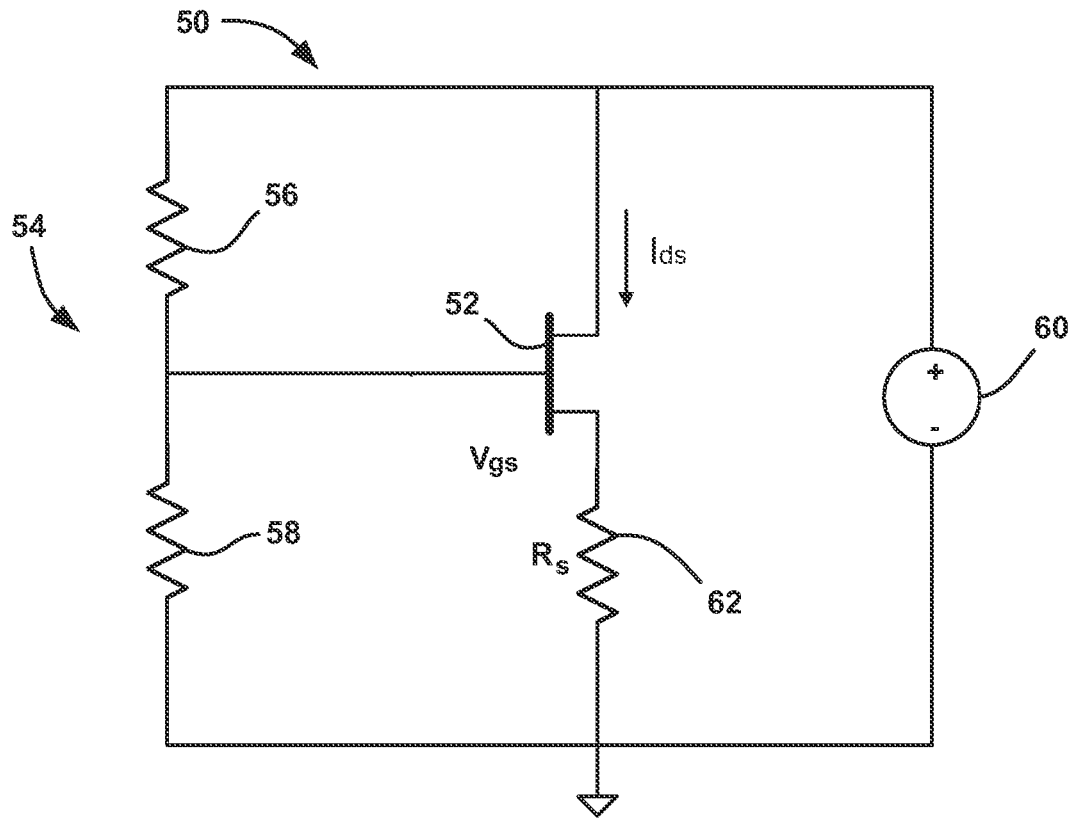
FIG. 2 is a schematic diagram of a known self-bias RF amplifier circuit.

FIG. 2 is a schematic diagram of a known self-bias RF amplifier circuit 50 including an FET device 52 having a source terminal, a gate terminal and a drain terminal. The input and output components for the RF signal being amplified are not shown in the circuit 50. The gate terminal of the FET device 52 receives a fixed reference voltage $V_g$ from a voltage divider 54 including resistors 56 and 58, where the voltage divider 54 divides a voltage potential from a voltage source 60 to provide the gate-to-source bias voltage $V_{gs}$. The voltage source 60 also provides the potential for the drain current $I_{ds}$ to provide the drain-to-source bias voltage $V_{ds}$. A source resistor 62 is electrically coupled to the source terminal of the FET device 52 to help control the bias voltage $V_{ds}$. The source resistor 62 provides stabilization of the drain current $I_{ds}$ by setting the gate-to-source bias voltage $V_{gs}$. However, this design has the disadvantage of requiring a relatively large amount of power to provide the additional source voltage.

Figure 3:
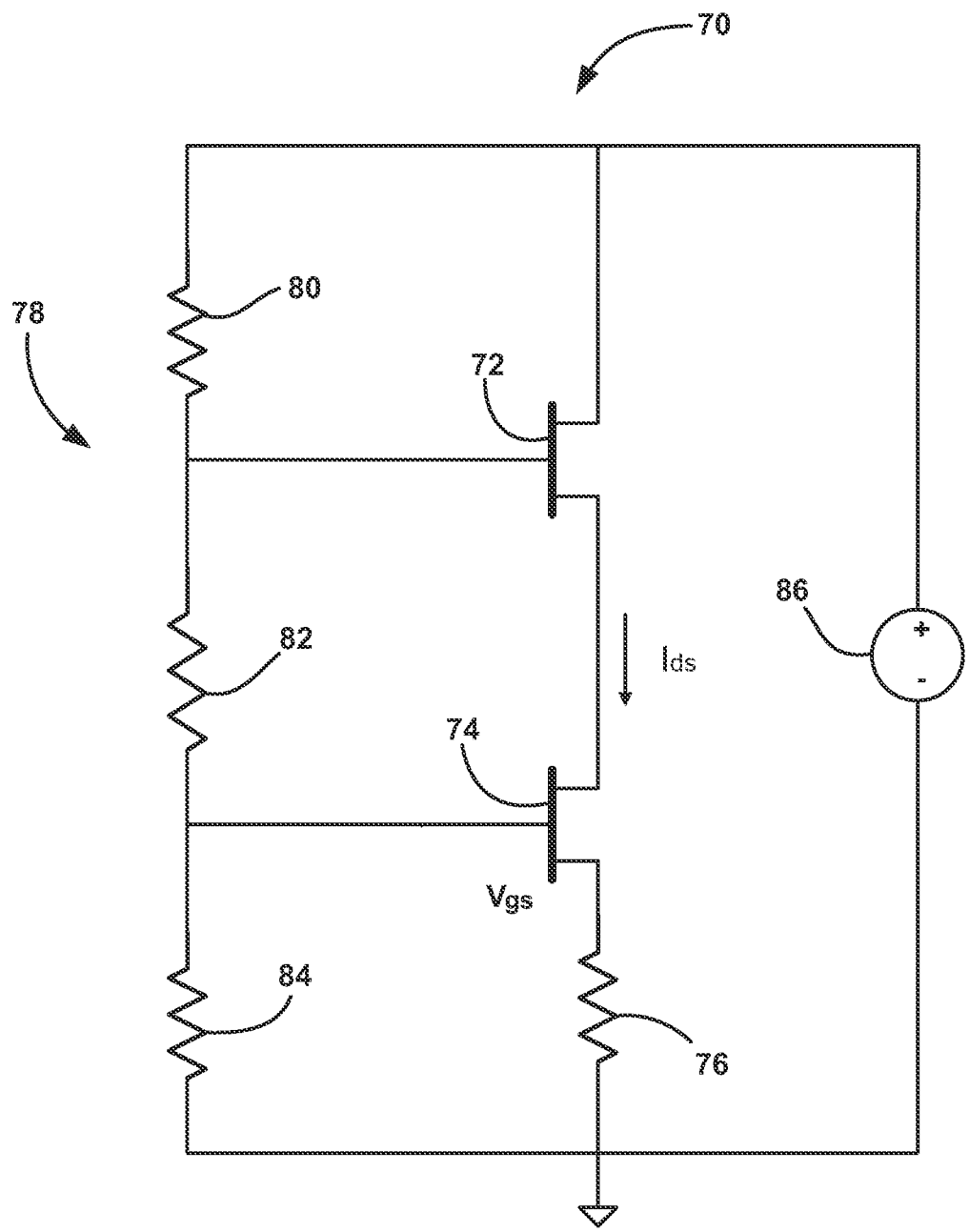
FIG. 3 is a schematic diagram of a known common stacked bias RF amplifier circuit.

It is known in the art to stack the FET devices in a RF amplifier circuit to provide higher efficiency or greater bandwidth. FIG. 3 is a schematic diagram of a known common stacked bias RF amplifier circuit 70. The input and output components for the RF signal being amplified are not shown in the circuit 70. The circuit 70 includes a stack of FET devices 72 and 74 each including a source terminal, a gate terminal and a drain terminal, where the source terminal of the FET device 72 is electrically coupled to the drain terminal of the FET device 74 in an electrical series configuration. The gate terminals of the FET devices 72 and 74 receive a fixed reference gate voltage $V_g$ from a voltage divider 78 including resistors 80, 82 and 84, where the voltage divider 78 is electrically coupled in parallel with a voltage source 86 to provide the voltage that is divided. The drain terminal of the FET device 74 is coupled to ground through a source resistor 76, where the source resistor 76 stabilizes the drain current $I_d$ through the FET devices 72 and 74.

Because the bias voltage $V_{gs}$ sets the drain current $I_{ds}$ through the stack of the FET devices 72 and 74, that voltage needs to remain consistent from device to device for a particular application. However, the processing for such bias circuits incorporating this design limits the ability to provide process consistency. Further, the bias design of the circuit 70 is susceptible to pinch off voltage variations, gate current and consumes excess DC power. Thus, if the drain current $I_{ds}$ significantly varies from device to device, then the optimal drain current for the particular application cannot be achieved. For example, if the drain current $I_{ds}$ is too high, it may be susceptible to temperature variations, and if it is too low, it may not provide the desired gain or the desired noise figure.

Figure 4:
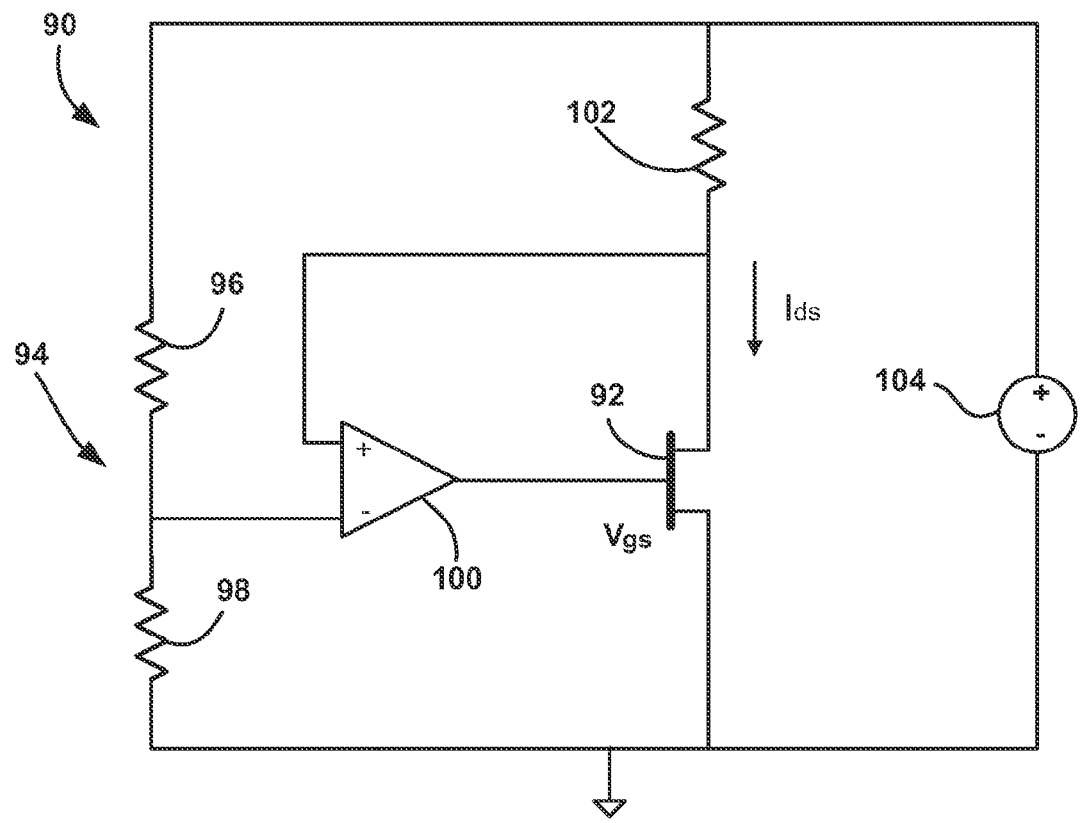
FIG. 4 is a schematic diagram of a known current regulator RF amplifier circuit.

FIG. 4 is a schematic diagram of a known current regulator bias RF amplifier circuit 90 including an FET device 92 having a source terminal, a gate terminal and a drain terminal. The input and output components for the RF signal being amplified are not shown in the circuit 90. The gate terminal of the FET device 92 receives a reference voltage $V_g$ from a voltage divider 94 including resistors 96 and 98 through an operational amplifier (op-amp) 100, where the voltage divider 94 is electrically couple in parallel with a voltage source 104 that provides the voltage that is divided. A sensing resistor 102 is electrically coupled to the drain terminal of the FET device 92, and the voltage sensed by the resistor 102 is coupled to the positive terminal of the op-amp 100, which increases the gain of the reference voltage $V_g$ provided to the gate terminal of the FET device 92. The sensing resistor 102 monitors the drain current $I_{ds}$ of the FET device 92 and provides feedback through the op-amp 100 to provide the gate-to-source bias $V_{gs}$. The op-amp 100 provides a more robust feedback, but with reduced overhead voltage. Particularly, only 0.2 volts is required to provide the current regulation. However, this biasing technique requires extra components and is not as robust as the self-bias technique during power-up conditions.

Figure 5:
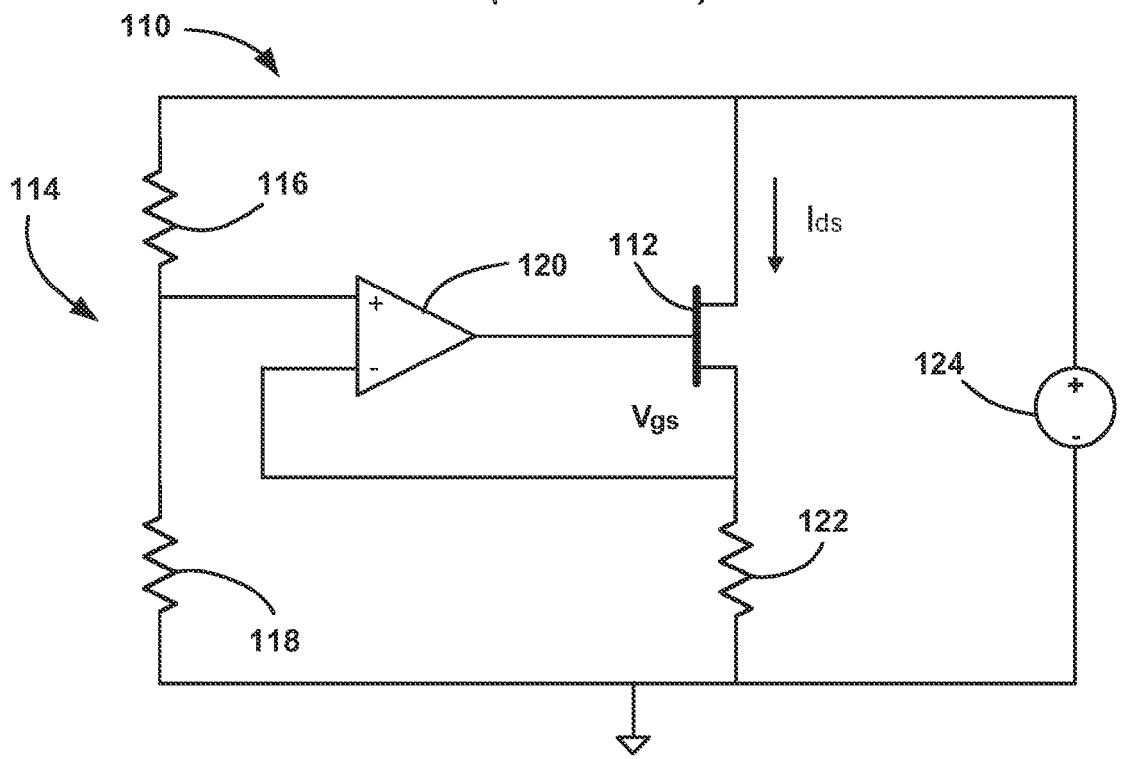
FIG. 5 is a schematic diagram of a source feedback current regulator RF amplifier circuit.

FIG. 5 is a schematic diagram of a source feedback current regulator bias RF amplifier circuit 110 including an FET device 112 having a source terminal, a gate terminal and a drain terminal. The input and output components for the RF signal being amplified are not shown in the circuit 110. The circuit 110 also includes a voltage divider 114 having resistors 116 and 118 that divides a voltage from a voltage source 124 and provides a reference voltage $V_g$ to a positive terminal of an op-amp 120. The circuit 110 also includes a source resistor 122 electrically coupled to the source terminal of the FET device 112 and ground, where the negative terminal of the op-amp 120 is electrically coupled to the source resistor 122. In this configuration, the drain current $I_{ds}$ passes through the source resistor 122 and provides feedback to the op-amp 120, which adjusts the gate-to-source bias voltage $V_{gs}$ to the desired drain current $I_d$. The source resistor 122 senses the drain current $I_{ds}$, which allows for a high accuracy bias with low overhead and provides the robustness of having a source resistance. The circuit 110 is a combination of the self-bias and current regulator bias approaches and provides feedback to set the bias voltage $V_{gs}$. This biasing technique has the advantages of the current regulator approach, but still maintains some of the robustness of the self-bias approach during power-up.

Figure 6:
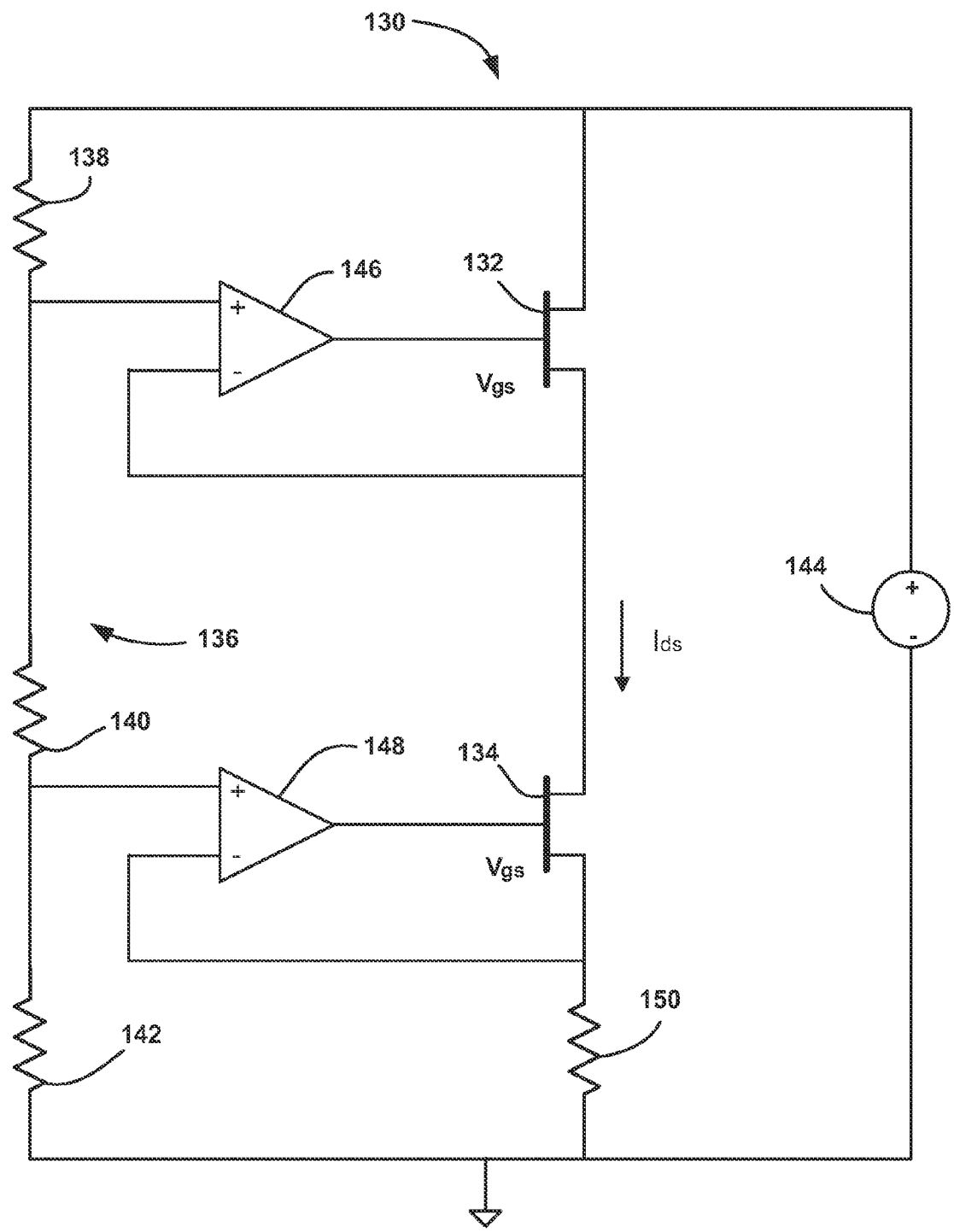
FIG. 6 is a schematic diagram of a stacked voltage/current regulator RF amplifier circuit.

FIG. 6 is a schematic diagram of a stacked voltage/current regulator RF amplifier circuit 130 including a stack of FET devices 132 and 134, each including a source terminal, a gate terminal and a drain terminal. The input and output components for the RF signal being amplified are not shown in the circuit 130. Although the amplifier circuit 130 includes two FET devices, this is by way of a non-limiting embodiment where the circuit 130 could include more FET devices, such as four stacked FET devices. The circuit 130 also includes a voltage divider 136 having resistors 138, 140 and 142 that divides a voltage potential from a voltage source 144 and provides a reference voltage that is desired to be the source voltage $V_s$ for each FET device 132 and 134 to positive terminals of op-amps 146 and 148. A negative terminal of the op-amp 146 is coupled to the source terminal of the FET device 132, and provides a feedback signal to correct the voltage to the gate terminal of the FET device 132. Likewise, the negative terminal of the op-amp 148 is electrically coupled to the source terminal of the FET device 132 and the op-amp 48 corrects the voltage at the gate terminal of the FET device 134. The drain current through the stack provides a voltage across a sensing resistor 150, which is fed back to adjust the gate voltage $V_g$ for the FET devices 132 and 134. As above, the op-amps 146 and 148 provide a more robust feedback from the source terminal of the particular FET device to which the bias voltage $V_{ds}$ is being provided based on the voltage divider 136 for precise control of each bias voltage $V_{ds}$ and the drain-to-source current $I_{ds}$.

The voltage potential of the source 144 and the reference voltages $V_g$ applied to the positive terminals of the op-amps 146 and 148 can be any suitable voltage for a particular application. In one non-limiting embodiment, the voltage source 144 provides 6.2 volts, the reference voltage $V_g$ provided to the positive terminal of the op-amp 146 is 3.2 volts, the reference voltage $V_g$ provided to the positive terminal of the op-amp 148 is 0.2 volts, the bias voltage $V_{ds}$ across the FET device 132 is 3 volts and the bias voltage $V_{ds}$ across the FET device 134 is 3 volts.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A RF amplifier circuit comprising:
    a plurality of stacked field effect transistor (FET) devices each including a drain terminal, a gate terminal and a source terminal, wherein a source terminal of at least one of the FET devices in the stack is electrically coupled to the drain terminal of another FET device in the stack, and wherein a bottom FET device in the stack of the FET devices is electrically coupled to ground;
    a voltage divider network including a plurality of resistors;
    a plurality of operational amplifiers where a separate one of the operational amplifiers is provided for each FET device in the stack, each operational amplifier including a positive input terminal, a negative input terminal and an output terminal, where the output terminal for a particular operational amplifier is electrically coupled to a gate terminal of a particular FET device, the negative input terminal of each operational amplifier is electrically coupled to the source terminal of the particular FET device and the positive input terminal of each operational amplifier is electrically coupled to a different location in the voltage divider network so that the source terminal provides a feedback voltage to the operational amplifier that controls a voltage applied to the gate terminal of the particular FET device;

a source resistor electrically coupled to the source terminal of the bottom FET device and ground; and a voltage source electrically coupled across the voltage divider network and providing the voltage that is divided.

2. The circuit according to claim 1 wherein the plurality of FET devices is two FET devices.

3. The circuit according to claim 2 wherein the voltage source provides about 6.2 volts.

4. The circuit according to claim 2 wherein the voltage divider network includes three resistors.

5. The circuit according to claim 2 wherein the voltage from the voltage divider network provided to the positive terminal of the operational amplifier for a top FET device in the stack is about 3.2 volts and the voltage potential provided to the positive terminal of the operational amplifier coupled to the bottom FET device is about 0.2 volts.

6. The circuit according to claim 5 wherein a drain-to-source voltage potential across the top FET device and the bottom FET device is about 3 volts.

7. The circuit according to claim 1 wherein the plurality of FET devices is four FET devices.

8. A circuit comprising:
at least one field effect transistor (FET) device including a drain terminal, a gate terminal and a source terminal;
a voltage divider network including a plurality of resistors;
at least one operation amplifier provided for the at least one FET device, where the operational amplifier includes a first input terminal, a second input terminal and an output terminal, and where the output terminal is electrically coupled to a gate terminal of the FET device, the first input terminal is electrically coupled to the source terminal of the FET device and the second input terminal is electrically coupled to the voltage divider network so that the source terminal provides a feedback voltage to the operational amplifier that controls a voltage applied to the gate terminal of the FET device;
a source resistor electrically coupled to the source terminal of the FET device; and
a voltage source electrically coupled across the voltage divider network and providing the voltage that is divided, wherein the at least one FET device is a plurality of stacked FET devices where a source terminal of at least one of the FET devices in the stack is electrically coupled to the drain terminal of another FET device in the stack, and wherein the at least operational amplifier is a plurality of operational amplifiers where one operational amplifier is provided for each FET device.

9. The circuit according to claim 8 wherein the plurality of FET devices is two FET devices.

10. The circuit according to claim 8 wherein the first input terminal is a negative terminal and the second input terminal is a positive terminal.

11. A RF amplifier circuit comprising:
a plurality of stacked field effect transistor (FET) devices each including a drain terminal, a gate terminal and a source terminal;
a voltage divider network including a plurality of resistors;
a plurality of operational amplifiers where a separate one of the operational amplifiers is provided for each FET device in the stack, each operational amplifier including a first input terminal, a second input terminal and an output terminal, where the output terminal for a particular operational amplifier is electrically coupled to gate terminal of a particular FET device, the first input terminal of each operational amplifier is electrically coupled to the source terminal of the particular FET device and the second input terminal of each operational amplifier is electrically coupled to the voltage divider network;
a source resistor electrically coupled to the source terminal of the bottom FET device in the stack; and
a voltage source electrically coupled across the voltage divider network and providing the voltage that is divided.

12. The circuit according to claim 11 wherein the plurality of FET devices is two FET devices.

13. The circuit according to claim 12 wherein the voltage divider network includes three resistors.

14. The circuit according to claim 11 wherein the plurality of FET devices is four FET devices.

15. The circuit according to claim 11 wherein the first input terminal is a negative terminal and the second input terminal is a positive terminal.

* * * * *